United States Patent
Pang (10) Patent No.: US 6,897,676 B1
(45) Date of Patent: May 24, 2005

(54) CONFIGURATION ENABLE BITS FOR PLD CONFIGURABLE BLOCKS

(75) Inventor: Raymond C. Pang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/454,055

(22) Filed: Jun. 4, 2003

(51) Int. Cl.⁷ ............................................. H03K 19/173
(52) U.S. Cl. ..................... 326/38; 326/39; 365/230.05; 365/189.01
(58) Field of Search ................. 326/38–39; 365/230.05, 365/189.01, 154

(56) References Cited

U.S. PATENT DOCUMENTS

| | | | |
|---|---|---|---|
| 5,552,722 A | 9/1996 | Kean | |
| 5,914,616 A | 6/1999 | Young et al. | |
| 5,933,023 A | 8/1999 | Young | |
| 6,049,487 A | * 4/2000 | Plants et al. | ............ 365/189.04 |
| 6,122,218 A | * 9/2000 | Kang | ..................... 365/230.05 |
| 6,262,596 B1 | 7/2001 | Schultz et al. | |
| 6,297,665 B1 | 10/2001 | Bauer et al. | |
| 6,373,779 B1 | 4/2002 | Pang et al. | |
| 6,526,557 B1 | 2/2003 | Young et al. | |
| 6,538,467 B2 | * 3/2003 | Bentz | ........................... 326/38 |

OTHER PUBLICATIONS

*Virtex–II Pro, Platform FPGA Handbook*, Oct. 14, 2002, pp. 11–17, (v2.0), Xilinx, Inc., 2100 Logic Drive, San Jose, CA 95124.

* cited by examiner

*Primary Examiner*—Vibol Tan
(74) *Attorney, Agent, or Firm*—William L. Paradice, III; Edel M. Young; Justin Liu (57) ABSTRACT

A programmable logic device (PLD) includes columns of block memory interposed between columns of configurable logic blocks (CLBs). Each column of block memory includes a plurality of random access memories (RAMs) that share common configuration address lines that do not allow the RAMs in block memory column to be individually addressed. For some embodiments, each RAM in the column includes interface logic that selectively enables the RAM during configuration operations in response to a configuration enable bit, which may be provided to the PLD in a configuration bitstream and stored in a shadow register associated with the RAM.

10 Claims, 8 Drawing Sheets

CONFIGURATION ENABLE BITS FOR PLD CONFIGURABLE BLOCKS

FIELD OF INVENTION

The present invention relates generally to using configurable memory blocks, and specifically to using a dedicated block random access memory (RAM) on a programmable logic device.

DESCRIPTION OF RELATED ART

A programmable logic device (PLD) is a general purpose device that can be programmed by an end user to perform one or more selected functions. One type of PLD is the Field Programmable Gate Array (FPGA), which typically includes an array of individually configurable logic blocks (CLBs) selectively connected to a plurality of input/output blocks (IOBs) by a programmable interconnect structure. As known in the art, the CLBS, IOBS, and programmable interconnect structure may be programmed to implement one or more selected functions by loading configuration data into configuration memory cells associated with the CLBs, IOBs, and programmable interconnect structure. The configuration data is typically provided to the FPGA as a serial bitstream from an external memory source.

Some FPGAs include dedicated blocks of random access memory (RAM) to provide high-density memory. For example, U.S. Pat. No. 5,933,023, which is incorporated herein by reference, describes an FPGA having columns of dual-port block RAM interposed between CLB columns. The block RAMs, which are accessible by the CLBS through either dedicated routing lines or the programmable interconnect structure, may be used to implement various functions such as, for example, register banks, first-in first-out (FIFO) buffers, state machines, and other functions. The contents of the block RAMs may be initialized to a predetermined state (e.g., to implement a state machine) during configuration of the FPGA by loading data from the configuration bitstream into the block RAMs via well-known shift registers and shadow registers.

Typically, each column of block RAM includes a plurality of individual block RAMs that share common address lines for configuration operations. Thus, when initializing the block RAMs, data may be written simultaneously to corresponding locations of all RAMs in a selected column without individually addressing each RAM in the column. However, although effective for initializing the entire block RAM column, the inability to individually address each block RAM in a column renders partial re-configuration of the block RAM column difficult.

For example, if a first number of RAMs in a column are configured to implement a state machine and a second number of RAMs in the column are configured for data storage, a user desiring to modify the state machine implemented by the first number of RAMs in the column is required to reconfigure all the RAMs in the column. Thus, to preserve data stored in the second number of RAMs in the column for further use, the data is typically transferred from the block RAM column to other memory on the FPGA (or even to external memory), temporarily stored therein before the block RAM column is re-configured, and then re-written to the second number of RAMs in the column during the re-configuration operation.

U.S. Pat. No. 5,552,722, which is incorporated by reference herein, allows access to sub-fields of configuration words stored in an FPGA's configuration memory by providing a separate mask register and placing a shift and mask unit between the external data bus and the configuration memory. However, the addition of the mask register and the shift and mask unit undesirably increases circuit complexity and consumes valuable silicon area.

Thus, it would be desirable to be able to individually address each RAM in a block RAM column of an FPGA during configuration operations without adding additional configuration address lines and without adding additional mask registers and shift units on the data bus.

SUMMARY

An apparatus and method are disclosed that allow individual memory elements within a column of a PLD to be individually addressed during configuration operations using existing, common configuration address lines. In accordance with one embodiment of the present invention, a plurality of configuration enable bits are included in the configuration bitstream. Each configuration enable bit indicates whether a corresponding memory element in a column is to be initialized during configuration. For one embodiment, an asserted configuration enable bit indicates that the corresponding memory element may be accessed during configuration, and a de-asserted configuration enable bit indicates that the corresponding memory element may not be accessed during configuration. In this manner, the configuration enable bits allow the memory elements in a column having common configuration address lines to be individually addressed during configuration operations.

For some embodiments, the configuration enable bit for each corresponding memory element is stored in a special location in the shadow register associated with the memory element. During configuration operations, configuration interface logic associated with the memory element reads the configuration enable bit from the shadow register and, in response thereto, selectively enables the memory element for configuration. For one embodiment, the configuration enable bit may be gated in the configuration interface logic with a well-known memory enable signal to control access to the memory element during configuration.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are discussed below in the context of a block RAM for simplicity only. It is to be understood that embodiments of the present invention are equally applicable to configurable memory elements other than block RAMs that use common configuration address lines to simultaneously access corresponding locations of multiple configurable memory elements. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary and, thus, may be modified (e.g., reversed polarity) as desired. Accordingly, the present invention is not to be construed as limited to specific examples described herein but rather includes within its scope all embodiments defined by the appended claims.

Figure 1:
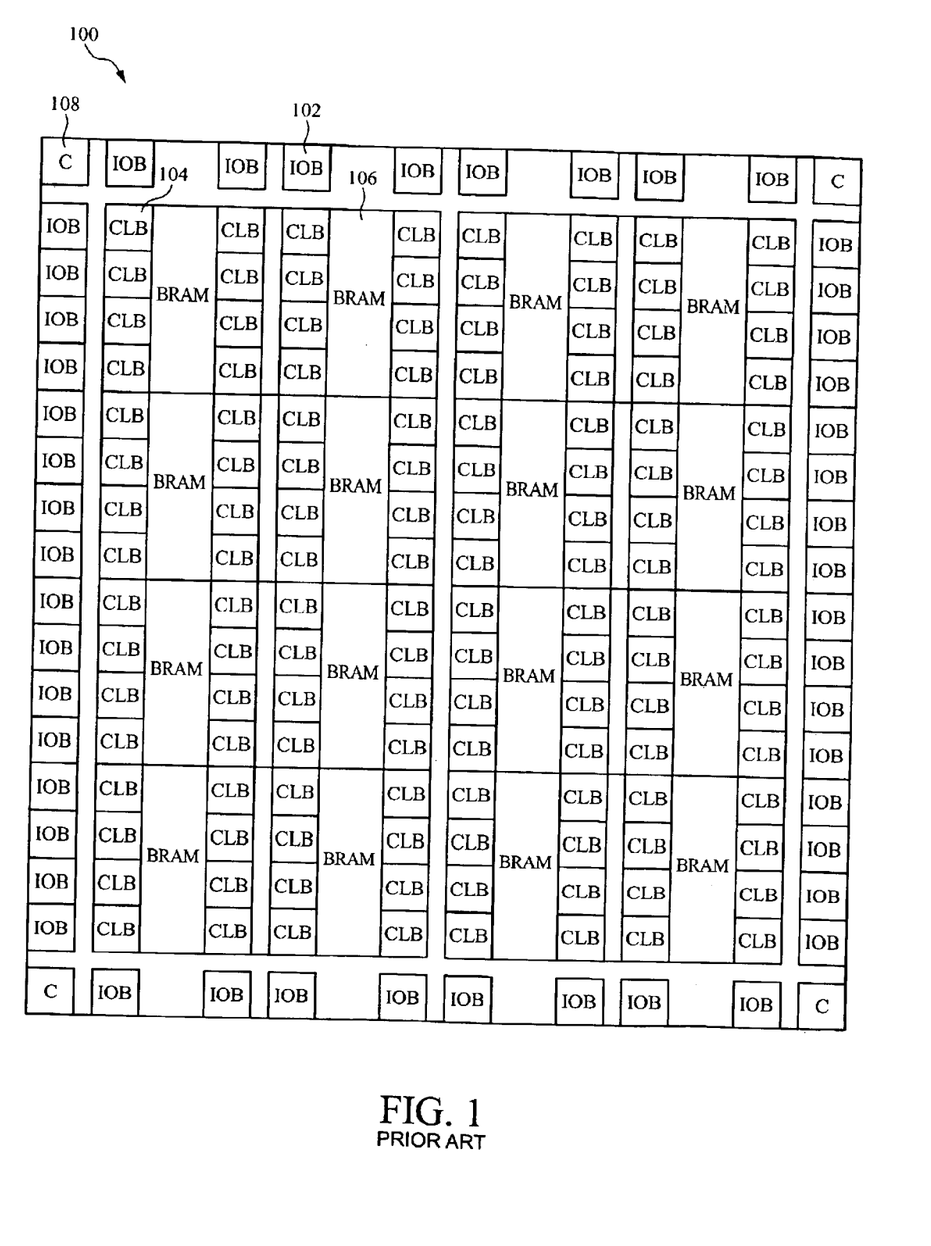
FIG. 1 is a block diagram of the general layout of an FPGA within which embodiments of the present invention may be implemented.

FIG. 1 is a block diagram that illustrates the general layout of IOBs, CLBs, block RAMs (BRAMs), and general interconnect circuitry of a field programmable gate array (FPGA) 100 within which some embodiments of the present invention may be implemented. IOBs 102 are well-known and are located around the perimeter of FPGA 100. CLBs 104 are well-known and are arranged in columns in FPGA 100. Block RAMs 106 are arranged in columns between adjacent CLB columns, and are described in more detail below. A well-known general programmable interconnect circuitry (not shown for simplicity) is provided to programmably connect the IOBs 102, CLBs 104, and block RAMs 106. Such circuitry is further described in U.S. Pat. Nos. 5,914,616, 5,933,023, 6,297,665, and 6,526,557, all incorporated herein by reference. A more detailed description of the general operation of FPGA 100 is also provided at pages 11–71 in the Xilinx Virtex-II Pro Platform FPGA Handbook, published October 2002, available from Xilinx, Inc. of San Jose, Calif. and incorporated by reference herein.

In addition, FPGA 100 includes well-known configuration circuitry 108 that provides various control signals during configuration of FPGA 100. For the embodiment of FIG. 1, configuration circuit 108 is shown to reside in a corner block (C) of FPGA 100. For other embodiments, the configuration circuit 108 may be located in more than one corner block, in a column, or located elsewhere on the FPGA. For one embodiment, configuration circuit 108 is of the type described in U.S. Pat. No. 6,262,596, incorporated herein by reference.

Each block RAM column extends the height of a CLB column and is separated from an adjacent block RAM column by a plurality of columns of CLBs. For the exemplary embodiment of FIG. 1, each block RAM column includes 4 block RAMs 106, each having a height equal to the height of four CLBs 104. For other embodiments, each block RAM column may include other numbers of block RAMs 106, and each block RAM 106 may have other heights. In addition, although only 4 block RAM columns and 8 CLB columns are shown in FIG. 1, FPGA 100 may include any number of block RAM columns and any number of CLB columns. Thus, although a particular FPGA layout is illustrated in FIG. 1, it is understood that many other FPGA layouts are possible, and are considered to fall within the scope of the present invention. For example, other embodiments can have other numbers of IOBs 102, CLBs 104, and block RAMs 106.

Figure 2:
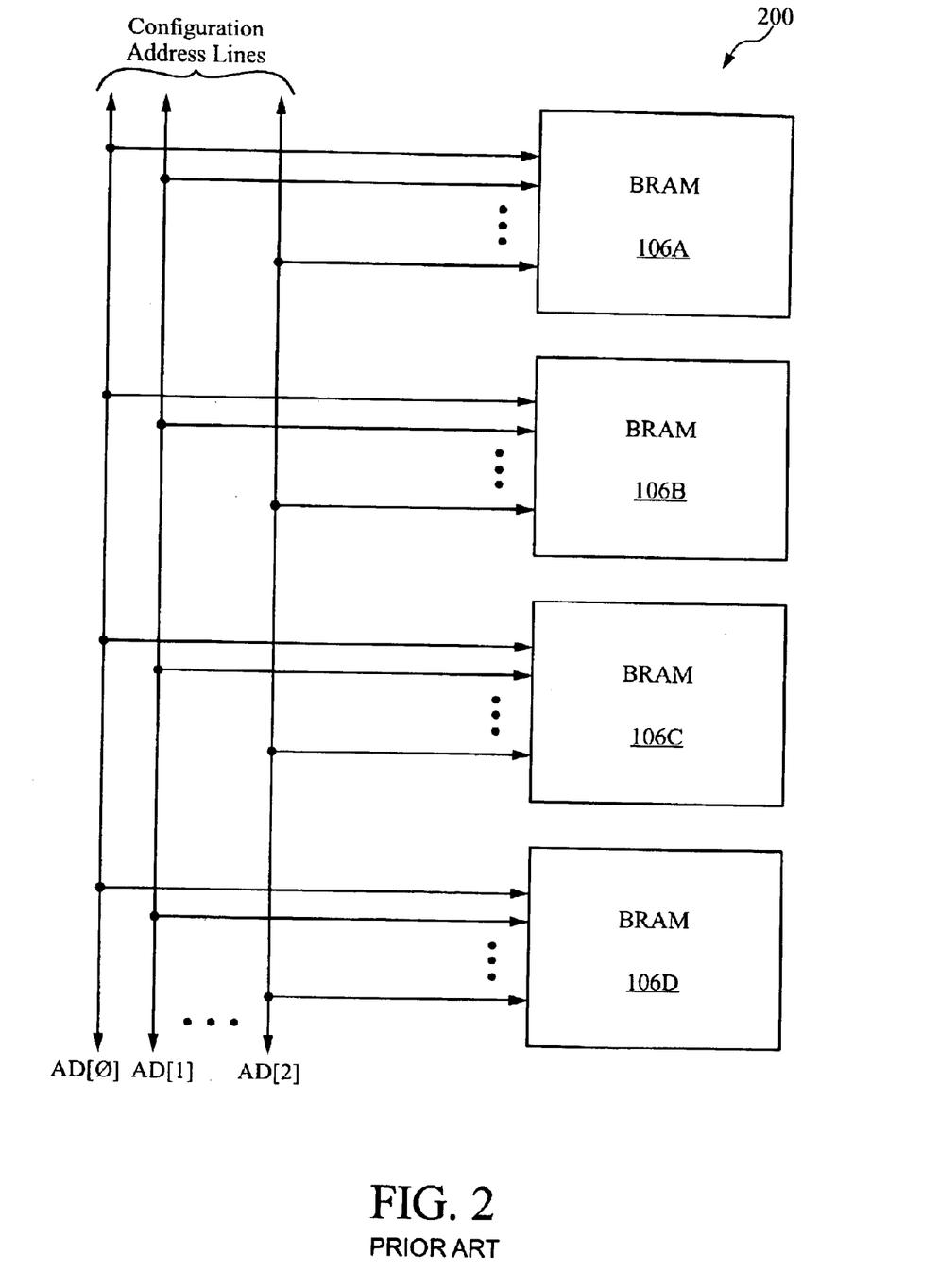
FIG. 2 is a block diagram of one embodiment of a column of memory elements for the FPGA of FIG. 1.

FIG. 2 shows a column 200 of block RAM for one embodiment of the present invention. Column 200 includes 4 block RAMs 106A–106D, each having a number of address terminals coupled to corresponding configuration address lines AD[n:0]. Configuration address lines AD[n:0] are common address lines used to simultaneously address corresponding locations of all block RAMs 106A–106D in column 200 during FPGA configuration operations. For some embodiments, the configuration address lines AD[n:0] receive address signals from configuration circuit 108. Thus, because the same address is provided to all block RAMs 106 in column 200 via configuration address lines AD[n:0], block RAMs 106A–106D of column 200 are not individually addressable during configuration operations via address lines AD[n:0].

Although not illustrated in FIG. 2, for some embodiments of FPGA 100, the block RAMs 106 in each column are also coupled to the general programmable interconnect circuitry, which allows the block RAMs 106 in a column to be individually addressed during normal FPGA operations (i.e., during non-configuration operations). See U.S. Pat. No. 5,933,023. However, the general programmable interconnect circuitry is typically not available for addressing block RAMs 106 during FPGA configuration operations (e.g., because the programmable interconnect circuitry may also be configured during FPGA configuration operations).

Figure 3:
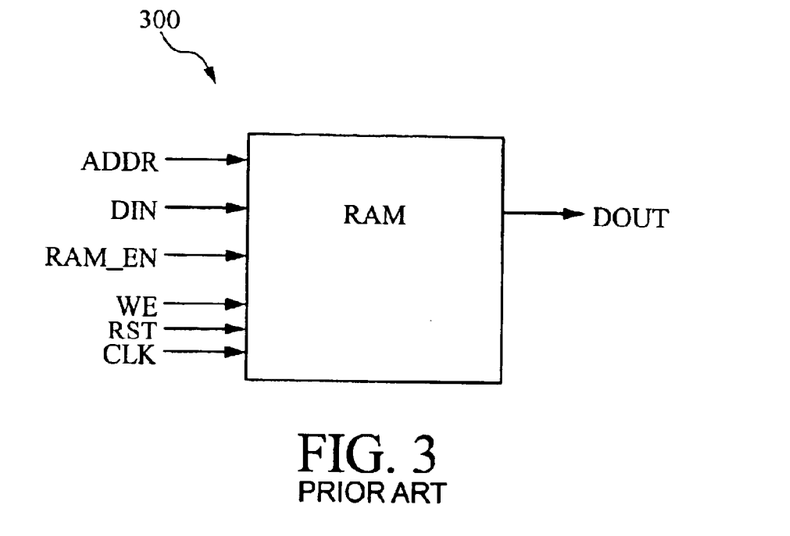
FIG. 3 is a simplified block diagram of one embodiment of a single-ported block RAM of the column of FIG. 2.

FIG. 3 shows a simplified block diagram of a block RAM 300 that is one embodiment of block RAM 106. Block RAM 300 includes an array containing any number of SRAM cells (not shown for simplicity). For one embodiment, the array contains 16384 SRAM cells that can be accessed as a 16384×1 array, a 8192×2 array, a 4096×4 array, or as a 2048×8 array, although other array configurations may be used. U.S. Pat. No. 5,933,023 describes a structure with these options. Block RAM 300 includes terminals for receiving an input address signal ADDR, an input data signal DIN, a RAM enable signal RAM_EN, a write enable signal WEN, a reset signal RST, and a clock signal CLK. In addition, block RAM 300 also includes terminals for providing an output data signal DOUT.

CLK is a user-defined clock signal that controls timing for read and write operations for block RAM 300. RAM_EN is a well-known enable signal that controls whether the RAM may be accessed for read and write operations. WEN is a well-known write enable signal that enables the block RAM for write operations, for example, by activating corresponding write drivers. RST is a well-known signal to reset the block RAM outputs.

Figure 4:
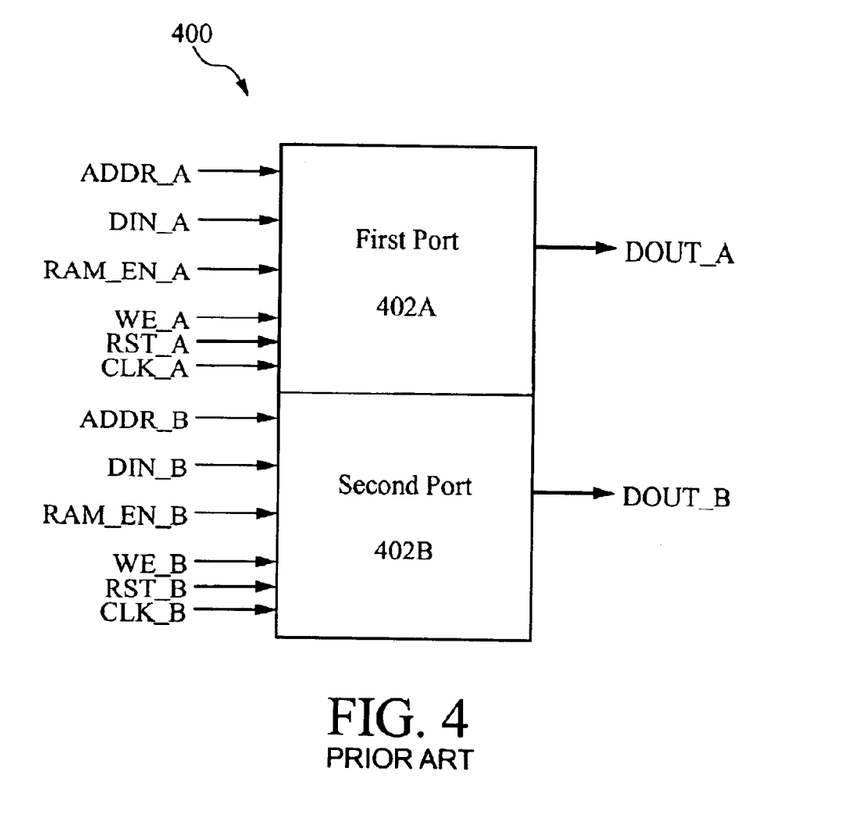
FIG. 4 is a simplified block diagram of one embodiment of a dual-ported block RAM of the column of FIG. 2.

For other embodiments, each block RAM 106 may be a dual-port RAM, as illustrated in FIG. 4. Dual-port block RAM 400 includes a first port 402A, a second port 402B, and an array containing SRAM cells (not shown for simplicity). For one embodiment, the array contains 16384

SRAM cells that can be accessed as a 16384×1 array, a 8192×2 array, a 4096×4 array, or as a 2048×8 array, although other array configurations may be used. The first port 402A of block RAM 400 includes terminals for receiving a first input address signal ADDR_A, a first input data signal DIN_A, a first write enable signal WEN_A, a first reset signal RST_A, and a first clock signal CLK_A. The second port 402B of block RAM 400 includes terminals for receiving a second input address signal ADDR_B, a second input data signal DIN_B, a second write enable signal WEN_B, a second reset signal RST_B, and a second clock signal CLK_B. In addition, the first port 402A of block RAM 400 also includes terminals for providing a first output data signal DOUT_A, and the second port 402B of block RAM 400 also includes terminals for providing a second output data signal DOUT_B.

Figure 5:
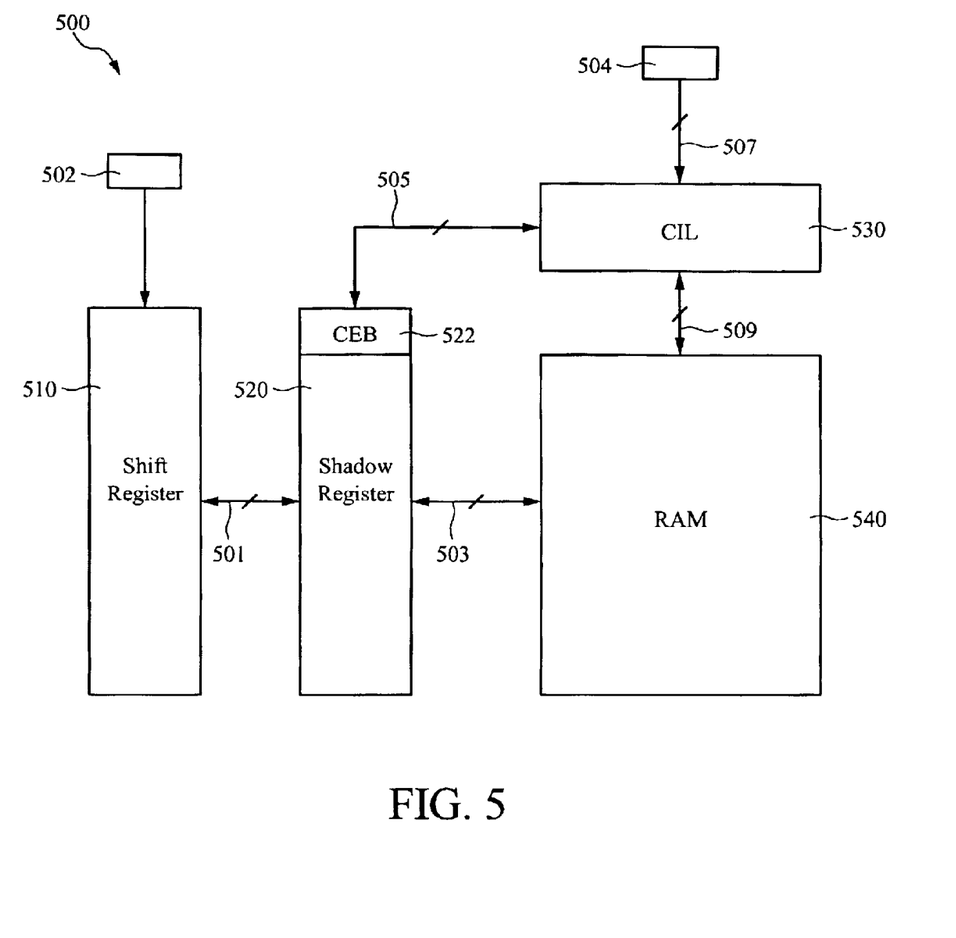
FIG. 5 is a block diagram of one embodiment of a memory element of the FPGA of FIG. 1.

FIG. 5 shows a block RAM 500 that is one embodiment of block RAM 106. Block RAM 500, which includes a shadow register 520, configuration interface logic (CIL) 530, and a RAM 540, is shown coupled to a shift register 510. Shift register 510, which is a series of latches or flip-flops (not shown for simplicity) that receives configuration data from a configuration bitstream 502 during FPGA configuration, is typically located in a central column (not shown) of the FPGA. During write operations, shift register 510 temporarily stores data received from bitstream 502 and transmits the data in parallel to shadow register 520 via bus 501. During read operations, shift register 510 stores data received from shadow register 520.

Shadow register 520 is a series of latches or flip-flops (not shown for simplicity) coupled to RAM 540 via bus 503. Shadow register 520 is used, for example, during configuration operations to transfer first configuration data (e.g., a first data frame) to RAM 540 while second configuration data (e.g., a second data frame) is being loaded from the bitstream 502 into the shift register 510. Shadow register 520 is coupled to RAM 540 via bus 503 and to CIL 530 via bus 505.

In accordance with some embodiments of the present invention, shadow register 520 includes an additional register 522 to store a configuration enable bit (CEB). The CEB indicates whether RAM 540 is to be addressed for writing during configuration operations. For one embodiment, an asserted (e.g., logic high) CEB enables RAM 540 to be addressed during configuration operations, and a de-asserted (e.g., logic low) CEB disables RAM 540 from being addressed during configuration operations. For some embodiments, the CEB is included in configuration bitstream 502 and is loaded into CEB register 522 via shift register 510. For other embodiments, CEB register 522 may be separate from shadow register 520.

CIL 530 is a state machine that controls operation of RAM 540 during configuration operations. CIL 530 receives various well-known memory control signals 504 from the configuration circuit 108 via bus 507. The control signals 504 include, for example, the configuration address ADDR, a configuration clock CLK_config, a configuration write mode signal WR, and an address enable signal EN_ADDR. CLK_config is a clock signal that controls RAM 540 during configuration operations. WR indicates whether FPGA 100 is in a configuration mode. For one embodiment, an asserted (e.g., logic high) WR indicates that FPGA 100 is performing configuration operations, and a de-asserted (e.g., logic low) WR indicates that FPGA 100 is not performing configuration operations. During configuration of the block RAMs, EN_ADDR is pulsed high for a number of cycles of CLK_config to clock data from shift register 510 to shadow register 520 as a configuration data frame. When the EN_ADDR pulse terminates, the configuration data is transferred from shadow register 520 to RAM 540 via bus 503. CIL 530 also reads the CEB from CEB register 522 via bus 505.

In response to input control signals 504 and the CEB, CIL 530 provides signals ADDR, RAM_EN, WEN, RST, and CLK (discussed above with respect to FIGS. 3 and 4) to RAM 540 via bus 509, and provides control signals CEB_RST and RAM_CTRL to shadow register 520/522 via bus 505. CEB_RST may be used to reset the CEB stored in CEB register 522, and RAM_CTRL may be used to allow CIL 530 to assume control of all inputs to RAM 540. As described in more detail below with respect to FIG. 7, during configuration operations, CIL 530 selectively enables its corresponding RAM 540 to be accessed for writing operations in response to CEB, thereby allowing each RAM 540 in a block RAM column of FPGA 100 to be individually addressed during configuration operations using existing, common configuration address lines (e.g., configuration address lines AD[n:0] of FIG. 2).

Figure 6:
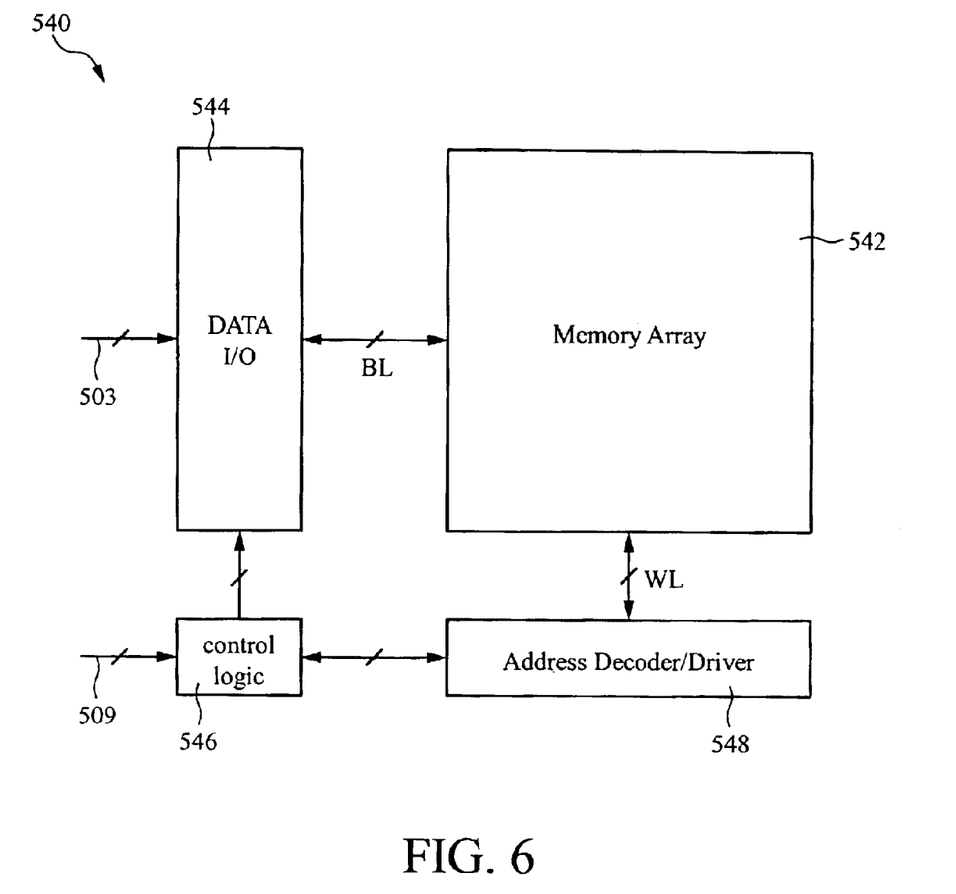
FIG. 6 is a block diagram of one embodiment of a RAM of FIG. 5.

RAM 540 may be any suitable RAM, including single-port and dual-port RAMs. FIG. 6 shows an exemplary embodiment of RAM 540 as including a memory array 542, a data input/output (I/O) circuit 544, control logic 546, and an address decoder/driver 548. For simplicity, RAM 540 is shown in FIG. 6 and described herein as a single-port RAM, although for some embodiments RAM 540 may be a dual-port RAM. For one embodiment, RAM 540 is a dual-port RAM with multiple write modes as described, for example, in U.S. Pat. No. 6,373,779, which is incorporated herein by reference. For other embodiments, RAM 540 may be another type of memory device residing within IOBs 102 and/or CLBs 104. For another embodiment, RAM 540 may be a look-up table provided within an FPGA configurable block.

Memory array 542 is well-known and includes a plurality of SRAM cells (not shown for simplicity) arranged in columns and rows. Each row of memory array 542 is coupled to data I/O circuit 544 via a corresponding bit line (BL), and each column of memory array 542 is coupled to address decoder/driver 548 via corresponding a word line (WL). For simplicity, the bit lines and word lines are shown collectively in FIG. 6.

Data I/O circuit 544 is coupled to shadow register 520 via bus 503, and includes well-known drivers to write data (e.g., DIN) to memory array 542 and well-known sense amplifiers to read data (e.g., DOUT) from memory array 542. Address decoder/driver 548, which is well-known, decodes addresses provided by control logic 546 to select word lines WL for read and write operations.

Control logic 546 is well-known and receives input signals ADDR, RAM_EN, WEN, RST, and CLK from CIL 530 on bus 509. In response to these input signals, control logic 546 controls read and write operations to memory array 542 by providing address and control signals to address decoder/driver 548 and providing control signals to data I/O circuit 544. For one embodiment, control logic 546 is of the type described in U.S. Pat. No. 6,373,779, which is referenced above.

Figure 7A:
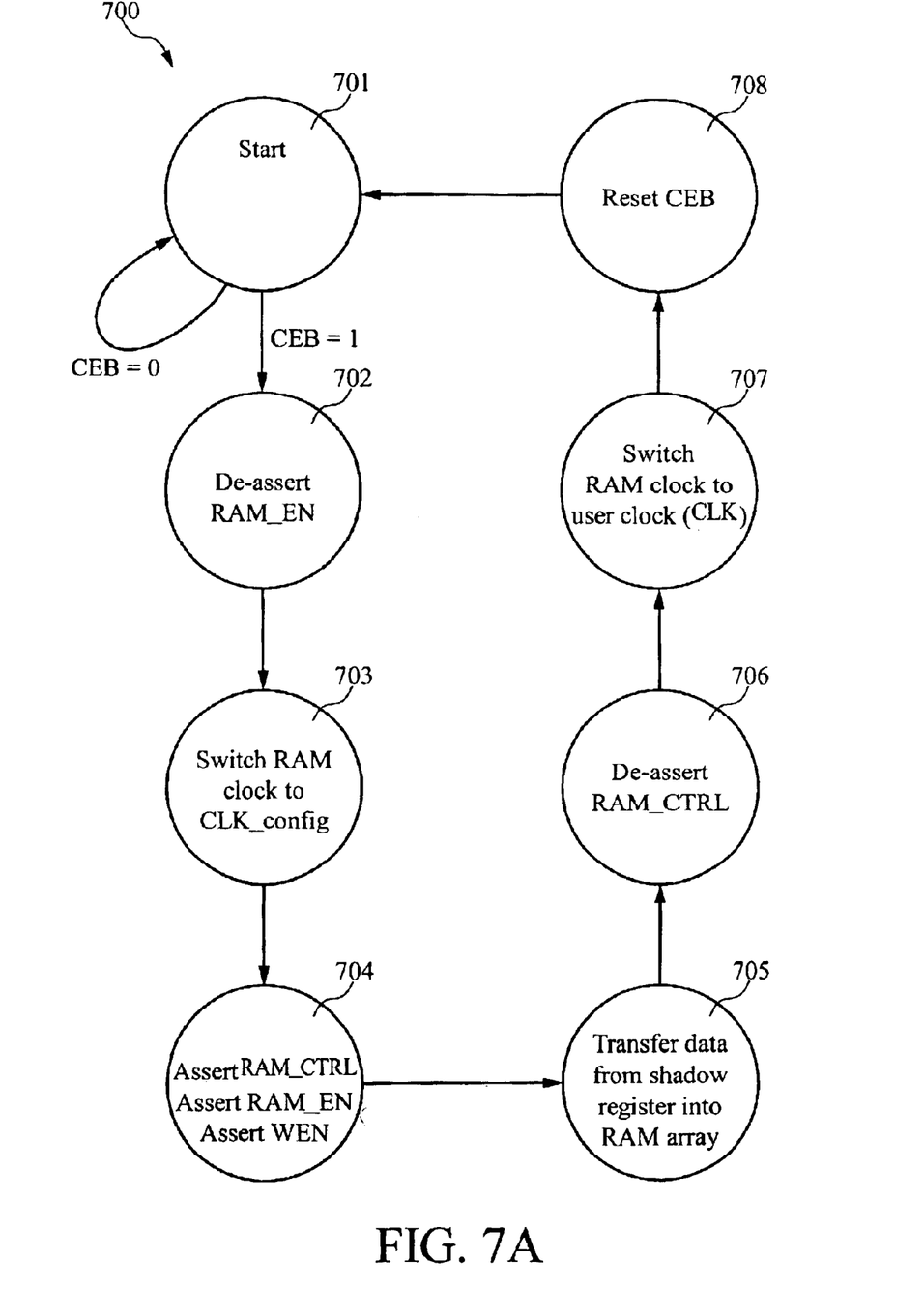
FIG. 7A shows a state machine illustrating operation of one embodiment of the configuration interface logic of FIG. 5.

FIG. 7A shows a state diagram 700 for one embodiment of CIL 530. During configuration operations, CIL 530 is initially in state 701, and monitors its inputs for a configuration address that selects the corresponding block RAM column. EN_ADDR pulses to transfer configuration data and CEB from the shift register to shadow register 520.

Then, if CEB is de-asserted (e.g., logic low), which indicates that RAM 540 corresponding to CIL 530 is not to be addressed, CIL 530 remains in state 701 and does not enable RAM 540 for configuration.

Conversely, if CEB is asserted (e.g., to logic high), which indicates that the RAM 540 is to be addressed for configuration, CIL 530 transitions to state 702 and temporarily disables RAM 540 by de-asserting RAM_EN to logic low. CIL 530 transitions to state 703, and provides the configuration clock CLK_config as the input clock for RAM 540. CIL 530 transitions to state 704, and asserts RAM_CTRL (e.g., to logic high) to assume control of RAM 540. In state 704, CIL 530 re-asserts RAM_EN and asserts WEN (e.g., to logic high), thereby enabling RAM 540 for configuration write operations.

Then, CIL 530 transitions to state 705, and causes the transfer of a configuration data frame from shadow register 520 to a location in RAM 540 identified by ADDR. When the transfer of the data to RAM 540 is complete, CIL transitions to state 706, and releases control of the RAM inputs by de-asserting RAM_CTRL. CIL 530 transitions to state 707, and switches the input clock to RAM 540 from CLK_config to the user clock signal CLK. CIL 530 then transitions to state 708, and de-asserts CEB (e.g., to logic low) to reset the CEB register 522. Thereafter, CIL 530 transitions to the initial state 701.

Figure 7B:
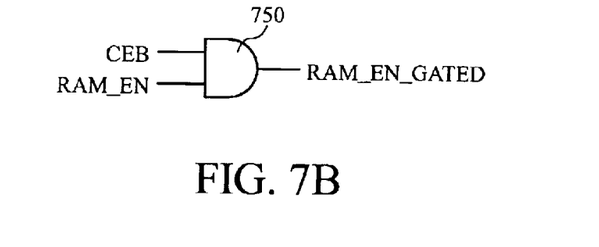
FIG. 7B shows a portion of one embodiment of the configuration interface logic of FIG. 5.

For some embodiments, CIL 530 selectively enables RAM 540 to participate in the configuration operation by gating CEB with RAM_EN. Referring to FIG. 7B, for some embodiments, CIL 530 includes an AND gate 750 having a first input to receive RAM_EN, a second input to receive CEB, and an output to provide a gated RAM enable signal RAM_EN_gated to RAM 540. Thus, if CEB is asserted, AND gate 750 outputs the state of RAM_EN as RAM_EN_gated, thereby allowing RAM 540 to participate in configuration operations. Conversely, if CEB is de-asserted, AND gate 750 forces RAM_EN_gated to a de-asserted state, thereby preventing RAM 540 from participating in configuration operations.

Figure 8:
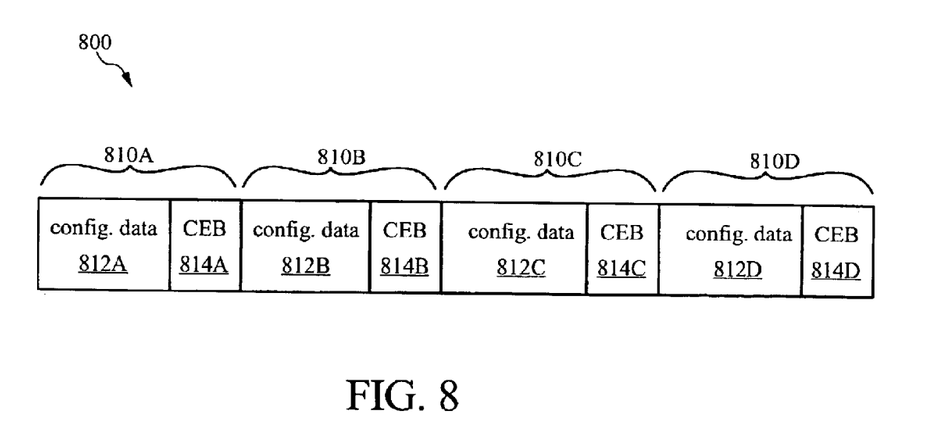
FIG. 8 is a block diagram of a frame of configuration data in accordance with one embodiment of the present invention.

FIG. 8 shows one embodiment of a frame 800 of configuration data for a block RAM column 200 of FPGA 100. Frame 800 includes four blocks 810A–810D, each having a configuration data field 812 and a CEB field 814. Configuration data field 812 stores configuration data to be written to a corresponding block RAM 106 of column 200, and CEB field 814 stores the CEB for the corresponding block RAM 106. The configuration data fields 812 may be any suitable length. For one embodiment, the width of each configuration data field 812 corresponds to the height (e.g., frame length) of each block RAM 106. Similarly, the CEB fields 814 may be any suitable length. For one embodiment, the CEB fields 814 store a 1-bit CEB. For other embodiments, the CEB fields 814 may store additional control information.

Figure 9:
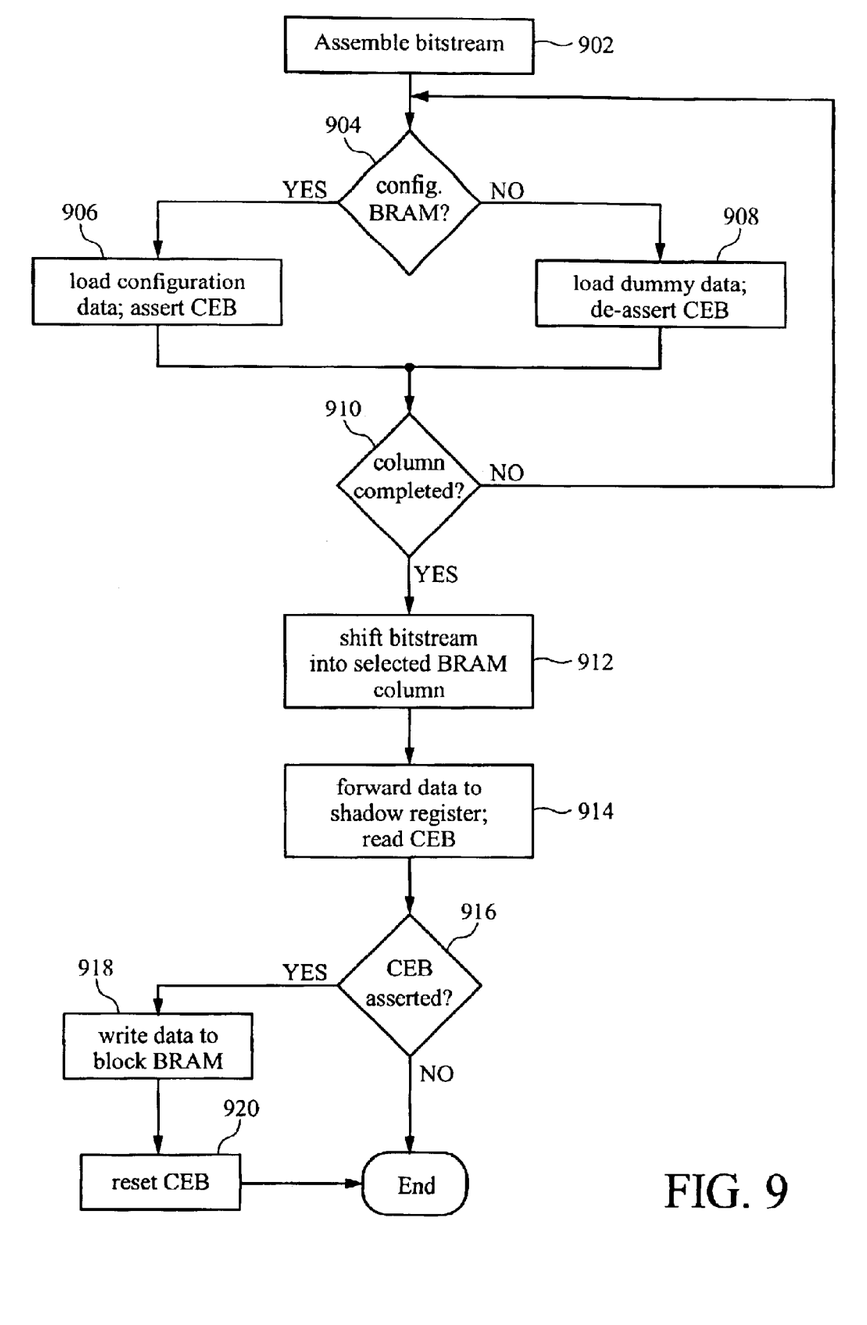
FIG. 9 is a flow chart illustrating one embodiment of a configuration operation for the FPGA of FIG. 1.

An exemplary operation to selectively configure individual block RAMS 106 of a block RAM column 200 of FPGA 100 is described below with respect to the flow chart of FIG. 9, with reference also being made to FIGS. 1–8. First, a frame of configuration data that is to be written into corresponding locations of block RAMs 106 in column 200 is assembled (902). As described above, configuration fields 812A–812D contain data that may be selectively written to corresponding block RAMs 106A–106D in response to the CEBs stored in the CEB fields 814A–814D, respectively.

Specifically, for each block RAM 106, if it is desired to initialize the block RAM 106 with predetermined data during FPGA configuration (904), then the data is loaded into the corresponding bitstream data field 812, and an asserted CEB is loaded into the corresponding bitstream CEB field 814 (906). Conversely, if it is not desired to initialize the block RAM 106 during configuration (904), then dummy data (e.g., all "0" or all "1") is loaded into the corresponding bitstream data field 812, and a de-asserted CEB is loaded into the corresponding bitstream CEB field 814 (908).

After fields 812 and 814 of frame 800 are assembled (910), frame 800 is provided as a configuration bitstream to FPGA 100 (912). Specifically, frame 800 is shifted into shift register 510 so that the contents of each data field 812 and CEB field 814 may be transferred to shadow register 520 and CEB register 522 for the corresponding block RAM 106. Thus, for example, the contents of configuration data fields 812A and 814A are loaded from the shift register 510 into the shadow register 520 and CEB register 522, respectively, for block RAM 106A, the contents of configuration data fields 812B and 814B are loaded from the shift register 510 into the shadow register 520 and CEB register 522, respectively, for block RAM 106B, and so on (914).

Then, for each block RAM, the CIL 530 reads CEB from CEB register 522 and, in response thereto, selectively enables the corresponding RAM 540 to participate in the configuration operation. Thus, if CEB is asserted (916), CIL 530 enables RAM 540 for the write operation, and the configuration data stored in shadow register 520 is written into a location of RAM 540 indicated by configuration address ADDR (918). Then, CIL 530 resets the CEB in CEB register 522 (e.g., to a de-asserted state) (920). Conversely, if the CEB is not asserted (916), CIL 530 disables RAM 540 for the configuration write operation.

Additional configuration data may be selectively written to other corresponding locations of the block RAMs 106 in column 200 in a similar manner by shifting subsequent frames of configuration data, including the CEBs, into corresponding shadow registers 520 and CEB registers 522, and then incrementing the address to RAM 540 via CIL 530. Similarly, other columns of block RAMs may be selectively configured as described above. In this manner, embodiments of the present invention advantageously allow each RAM array in a block RAM column to be individually addressed during configuration operations using common configuration address lines. Thus, by using CEBs included in the configuration bitstream to select individual RAMs in a block RAM column for configuration, existing FPGA architectures which use common address lines to access corresponding locations in the RAM arrays of each block RAM column during configuration may be used to partially configure each block RAM column.

The ability to selectively configure one or more RAMs in each block RAM column of an FPGA is advantageous. For example, referring again to FIG. 2, if block RAMs 106A and 106B are configured to implement state machines and block RAMs 106C and 106D are configured as FIFO memories, the state machines implemented by block RAMs 106A and 106B may be modified (e.g., re-configured with new initialization data) without altering data stored in block RAMs 106C and 106D.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

Specifically, although described above in the context of block RAMS, embodiments of the present invention are equally applicable to selectively addressing other FPGA elements (e.g., CLBs, IOBS, configuration memory arrays, look-up tables, and so on) during configuration without using the general programmable interconnect structure.

What is claimed is:

1. A method of configuring a programmable logic device (PLD) including one or more columns of block memory each having a plurality of random access memories (RAMs), the method comprising:

providing configuration data as a bitstream to the PLD, the bitstream including a plurality of configuration enable bits each indicating whether a corresponding RAM in the column of block memory is to be enabled for the configuration operation; and for each RAM in a selected column of block memory, selectively enabling the RAM for write operations in response to the corresponding configuration enable bit.

2. The method of claim 1, wherein the selectively enabling further comprises:

storing each configuration enable bit in a shadow register for the corresponding RAM;
logically combining the configuration enable bit with a RAM enable signal to generate a gated RAM enable signal; and providing the gated RAM enable signal to the memory cell array.

3. The method of claim 1, further comprising:

writing configuration data into the RAM if the corresponding configuration enable bit is asserted; and resetting the configuration enable bit stored in the shadow register.

4. The method of claim 1, wherein the RAMs in each column of block memory share common configuration address lines.

5. A method of configuring a programmable logic device (PLD) including one or more columns of block memory each having a plurality of random access memories (RAMs), the method comprising:

receiving a configuration bitstream having a plurality of fields, each field including data and a configuration enable bit for a corresponding RAM; and for each RAM in a selected column of block memory, selectively enabling the RAM for configuration in response to the corresponding configuration enable bit.

6. The method of claim 5, further comprising:

for each RAM in the selected column of block memory, writing data into the RAM if the corresponding configuration enable bit is asserted.

7. The method of claim 5, wherein the RAMs in each column of block memory share common configuration address lines.

8. A method of configuring a programmable logic device (PLD) including one or more columns of block memory each having a plurality of random access memories (RAMs), the method comprising:

constructing a configuration bitstream to include a plurality of configuration enable bits, each configuration enable bit indicating whether a corresponding RAM in a selected column of block memory is to be enabled for configuration;

providing the configuration bitstream to the PLD; and selectively enabling the RAMs in the selected column of block memory in response to the configuration enable bits.

9. The method of claim 8, further comprising:

writing configuration data into the RAM if the corresponding configuration enable bit is asserted; and resetting the configuration enable bit stored in the shadow register.

10. The method of claim 8, wherein the RAMs in each column of block memory share common configuration address lines.

* * * * *